US008786881B2

(12) United States Patent
Yamada

(10) Patent No.: US 8,786,881 B2
(45) Date of Patent: Jul. 22, 2014

(54) PRINTING APPARATUS TO DETERMINE CORRECTION ON SUSPENDED IMAGE DATA

(75) Inventor: Akihiro Yamada, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 325 days.

(21) Appl. No.: 13/042,113

(22) Filed: Mar. 7, 2011

(65) Prior Publication Data

US 2011/0242589 A1 Oct. 6, 2011

(30) Foreign Application Priority Data

Mar. 31, 2010 (JP) ................................ 2010-082794

(51) Int. Cl.
*G03F 3/08* (2006.01)
*H04N 1/40* (2006.01)

(52) U.S. Cl.
USPC .......... 358/1.15; 358/519; 358/520; 358/521; 358/522; 358/448; 358/461

(58) Field of Classification Search
None
See application file for complete search history.

(56) References Cited

U.S. PATENT DOCUMENTS

| | | | | |
|---|---|---|---|---|
| 2004/0032615 | A1 | 2/2004 | Kurakata | |
| 2005/0063725 | A1 | 3/2005 | Matsukura | |
| 2007/0070460 | A1 * | 3/2007 | Yamada | 358/504 |
| 2007/0146829 | A9 * | 6/2007 | Coons et al. | 358/504 |
| 2008/0095563 | A1 | 4/2008 | Miyashita et al. | |
| 2010/0067928 | A1 * | 3/2010 | Ozawa | 399/39 |

FOREIGN PATENT DOCUMENTS

| | | | |
|---|---|---|---|
| CN | 1284075 | C | 11/2006 |
| CN | 100528588 | C | 8/2009 |
| JP | H06-103005 | A | 4/1994 |
| JP | 2003-186657 | A | 7/2003 |
| JP | 2004-054143 | A | 2/2004 |
| JP | 2004-074561 | A | 3/2004 |
| JP | 2007-090561 | A | 12/2007 |
| JP | 2008-298867 | A | 12/2008 |
| JP | 2009-252212 | A | 10/2009 |

OTHER PUBLICATIONS

Japan Patent Office, Decision of Patent Grant for Japanese Patent Application No. 2010-082794 (counterpart to above-captioned patent application), dispatched Feb. 14, 2012.
State Intellectual Property Office of the People's Republic of China, Notification of First Office Action for Chinese Patent Application No. 201110080028.7 (counterpart to above-captioned patent application), mailed Jun. 5, 2013.

* cited by examiner

*Primary Examiner* — Benny Q Tieu
*Assistant Examiner* — Haris Sabah
(74) *Attorney, Agent, or Firm* — Baker Botts L.L.P.

(57) ABSTRACT

A printing apparatus comprising: a printing unit configured to print an image based on expanded data; a measuring unit configured to measure a deviation amount of at least one of a position and a density of the image printed by the printing unit when a correction execution condition is satisfied; an expanding unit configured to expand print data based on the measurement by the measuring unit, so as to produce the expanded data; and a control unit, wherein when the correction execution condition is satisfied during the expanding of current print data which corresponds to a current page being expanded, the control unit is configured to control the expanding unit to suspend the expanding of the current print data, the measuring unit to measure the deviation amount, and the expanding unit to restart expanding an unexpanded portion of the current print data based on the measurement.

12 Claims, 6 Drawing Sheets

PRINTING APPARATUS TO DETERMINE CORRECTION ON SUSPENDED IMAGE DATA

CROSS-REFERENCE TO RELATED APPLICATIONS

This application claims priority from Japanese Patent Application No. 2010-082794 filed on Mar. 31, 2010, the entire contents of which are incorporated herein by reference.

TECHNICAL FIELD

Aspects of the present invention relates to a printing apparatus, particularly to a printing apparatus and a storing medium for storing a printing program, which can correct printing positions and printing densities.

BACKGROUND

There has been proposed a related-art printing apparatus which equips an image correction function that measures the deviation amount of a position and a density of a formed image and corrects the position and the density to reduce the measured deviation amount. When the image correction function is executed frequently, the quality of the image can be ensured. However, there are disadvantages such as a user has to wait for a long time or consumption of ink and toner is increased, due to especially the measurement of the deviation amount.

Therefore, in the related-art printing apparatus, when a predetermined correction execution condition is satisfied, for example, when a number of pages copied or a time elapsed after a previous image correction function was executed exceeds a predetermined value, the measurement of the deviation amount is executed. In addition, when print data is received during the measurement of the deviation amount, the print data is stored, and after the measurement of the deviation amount is finished, the print data which has been stored is expanded based on the result of the measurement of the deviation amount.

Generally, a related-art printing apparatus expands the print data per page and prints the expanded data successively. Therefore, the correction execution condition may be satisfied during expanding process of the print data per page. However, in the related-art printing apparatus, the way of executing the expanding process when the correction execution condition is satisfied during the expanding process of the print data per page is not considered. For example, if the deviation amount is measured after the expanding process, reflecting the measured deviation amount to the expanding process will be delayed.

SUMMARY

Accordingly, it is an aspect of the present invention to provide a printing apparatus and a storing medium for storing a printing program, which can prevent delay in reflecting the measured deviation amount to the expanding process of the print data when the correction execution condition is satisfied during the expanding process of the print data per page.

According to an exemplary embodiment of the present invention, there is provided a printing apparatus comprising: a printing unit configured to print an image based on expanded data; a measuring unit configured to measure a deviation amount of at least one of a position and a density of the image printed by the printing unit when a correction execution condition is satisfied; an expanding unit configured to expand print data based on the measurement by the measuring unit, so as to produce the expanded data; and a control unit, wherein when the correction execution condition is satisfied during the expanding of current print data which corresponds to a current page being expanded, the control unit is configured to control the expanding unit to suspend the expanding of the current print data, the measuring unit to measure the deviation amount, and the expanding unit to restart expanding an unexpanded portion of the current print data based on the measurement performed after the expanding is suspended.

According to another exemplary embodiment of the present invention, there is provided a printing apparatus comprising: a printing unit configured to print an image based on expanded data; a measuring unit configured to measure a deviation amount of at least one of a position and a density of the image printed by the printing unit when a correction execution condition is satisfied; an expanding unit configured to expand print data based on the measurement by the measuring unit, so as to produce the expanded data; a first determining unit, wherein when a print request is received, the first determining unit is configured to determine whether the correction execution condition may be satisfied during the expanding of the print data corresponding to the print request, before the print data is expanded, and a control unit, wherein when the first determining unit determines that the correction execution condition may be satisfied, the control unit is configured to control the expanding unit to delay the expanding of the print data, the measurement unit to measure the deviation amount, and the expanding unit to start expanding the print data which was delayed from expanding based on the measurement performed after the expanding is delayed.

According to another exemplary embodiment of the present invention, there is provided a computer readable storing medium storing a computer program for causing a printing apparatus, the printing apparatus comprising a printing unit configured to print an image based on expanded data, to perform a method of: measuring a deviation amount of at least one of a position and a density of the image printed by the printing unit when a correction execution condition is satisfied; expanding print data based on the measurement by the measuring unit, so as to produce the expanded data; and when the correction execution condition is satisfied during the expanding of current print data which corresponds to a current page being expanded, suspending the expanding of the current print data, measuring the deviation amount, and restarting expanding an unexpanded portion of the current print data based on the measurement performed after the expanding is suspended.

According to another exemplary embodiment of the present invention, there is provided a computer readable storing medium storing a computer program for causing a printing apparatus, the printing apparatus comprising a printing unit configured to print an image based on expanded data, to perform a method of: measuring a deviation amount of at least one of a position and a density of the image printed by the printing unit when a correction execution condition is satisfied; expanding print data based on the measurement by the measuring unit, so as to produce the expanded data; determining whether the correction execution condition may be satisfied during the expanding of the print data corresponding to the print request, before the print data is expanded, when a print request is received, and when it is determined that the correction execution condition may be satisfied, delaying the expanding of the print data, measuring the deviation amount, and starting expanding the print data which was delayed from expanding based on the measurement performed after the expanding is delayed.

DETAILED DESCRIPTION

<First Exemplary Embodiment>

Next, the first exemplary embodiment of the present invention will be described with reference to FIGS. 1 to 5.

(Overall configuration of a printer)

Figure 1:
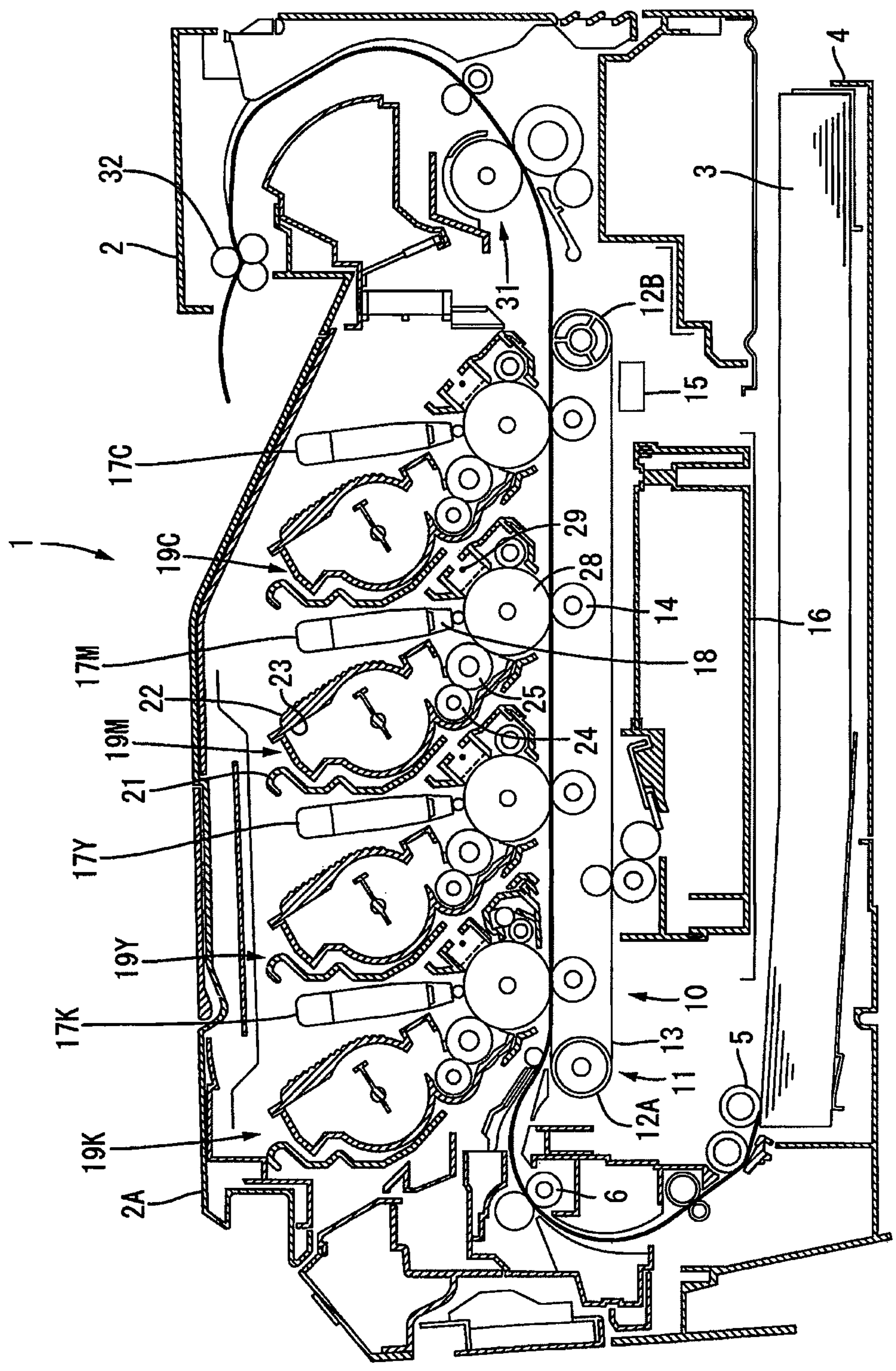
FIG. 1 is a sectional side view showing the schematic configuration of a printer according to a first exemplary embodiment of the present invention.

FIG. 1 is a sectional side view showing a schematic configuration of a printer 1 (an example of the "printing apparatus" of the present invention) according to the first exemplary embodiment of the present invention. The printer 1 is an electro photographic color LED printer. Hereinafter, a left side of the figure is regarded as a front side of the printer. In addition, in FIG. 1, some symbols of components, which are identical for respective colors, are omitted.

The printer 1 includes a body casing 2. A feed tray 4 which can carry multiple sheets 3 (an example of a transfer medium) is attached at the bottom of the body casing 2. The sheets 3 loaded on the feed tray 4 are delivered to a registration roller 6 provided at an upper side of the feed tray 4 by a supply roller 5 provided on the upper front edge of the feed tray 4. The registration roller 6 conveys the sheets 3 to a belt unit 11 of a printing unit 10.

The printing unit 10 mainly includes the belt unit 11, exposure units 17 (17K, 17Y, 17M, and 17C), process units 19 (19K, 19Y, 19M and 19C) and a fixing unit 31.

The belt unit 11 has an annular belt 13 stretched between front and rear paired belt support rollers 12A and 12B. The sheets 3, which are adsorbed onto the belt 13 by static electricity, are conveyed backward by driving the belt 13. In addition, transfer rollers 14 are provided inside the belt 13 at positions facing photoconductive drums 28 of the process units 19 with the belt 13 therebetween.

The exposure units 17K, 17Y, 17M and 17C correspond to black, yellow, magenta and cyan respectively. Each exposure unit includes a LED head 18 at a lower end portion. The LED head 18 has multiple LEDs arranged in a row. The exposure units 17 let each LED of the LED head 18 emit light according to the print data supplied to each exposure unit 17. The light is scanned on the corresponding photoconductive drum 28 one line at a time.

A pattern sensor 15 (an example of the "measuring unit" of the invention), which is used, for example, detecting patterns formed on the surface of the belt 13, is provided below the belt 13. The pattern sensor 15 irradiates to the surface of the belt 13, receives the reflected light by a phototransistor, and outputs a signal depending on an amount of the received light. Furthermore, a cleaner 16, which recycles toner and paper dust adhered to the belt 13, is provided below the belt unit 11.

The process units 19K, 19Y, 19M and 19C correspond to black, yellow, magenta and cyan respectively. Each process unit includes a frame 21 and a developing cartridge 22. Each developing cartridge 22 includes a toner storage chamber 23, a supply roller 24 and a developing roller 25. The toner storage chamber 23 stores a toner of a corresponding color. The toner removed from the toner storage chamber 23 is supplied to the developing roller 25 by rotating the supply roller 24. The toner is positively charged by friction between the supply roller 24 and the developing roller 25.

In addition, the photoconductive drum 28 and a scorotron charger 29 are provided at a lower portion of the frame 21. The photoconductive drum 28 is formed by providing a positively charged photoconductive layer on a surface of a cylindrical drum body connected to the ground. The surface of the photoconductive drum 28 is uniformly positively charged (for example, +900V) by discharging from the charger 29 as the drum 28 rotates. By being exposed by scanning from the exposure units 17, the surface voltage becomes partially low (for example +100 V), corresponding to the intensity of the irradiated light. An electrostatic latent image corresponding to the image to be formed on the sheet 3 is formed thereby.

The toner which is positively charged and carried by the developing roller 25 is supplied to the electrostatic latent image on the photoconductive drum 28 by applying a developing bias voltage (for example +450V) to the developing roller 25. In this way, the electrostatic latent image on the photoconductive drum 28 is made visible as a toner image.

When the sheet 3 on the belt 13 passes through each transfer position between each photoconductive drum 28 and each transfer roller 14, the toner images carried on the photoconductive drum 28 are sequentially transferred to the sheet 3 by applying a transfer bias voltage (for example −700 V) to the transfer roller 14, so as to be superposed. The sheets 3 to which the toner images are transferred enter into the fixing unit 31, which is provided at the back of the body casing 2. Then the toner images are thermally fixed to the sheet 3. The sheet 3 is then conveyed upward, and discharged from the top of the body casing 2 by a discharging roller 32.

(Electrical Configuration of the Printing Apparatus)

Figure 2:
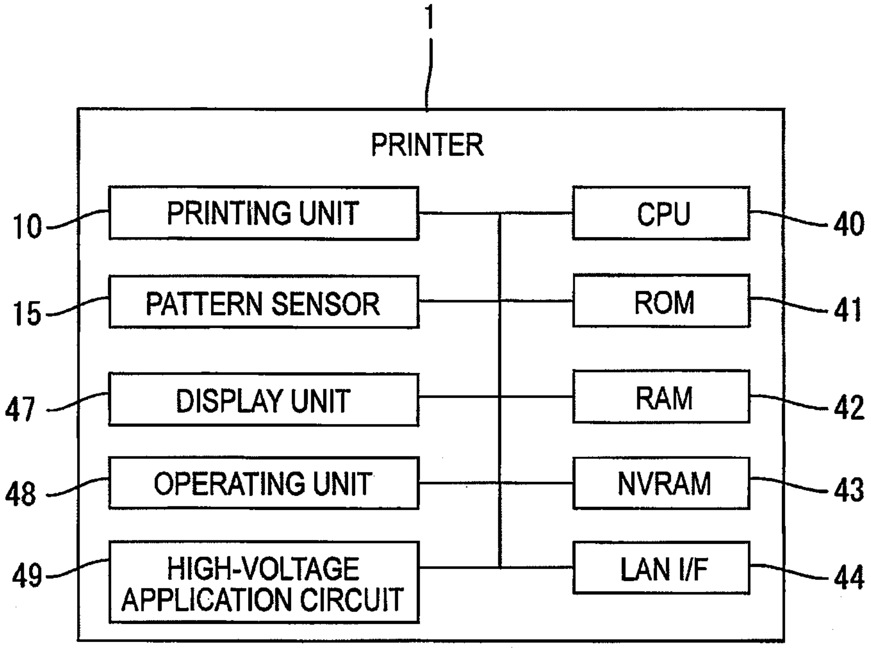
FIG. 2 is a block diagram briefly showing an electric configuration of the printer.

FIG. 2 is a block diagram briefly showing an electric configuration of the printer 1.

As shown in FIG. 2, the printer 1 includes a central processing unit (CPU) 40, a read-only memory (ROM) 41, a random access memory (RAM) 42, a non-volatile read only memory (NVRAM) 43, and a network interface 44. A program for executing various operations of the printer 1, such as a job execution process which will be described later, is stored in the ROM 41. The CPU 40 (an example of the "receiving unit, first judging unit, measuring unit, expanding unit and control unit" of the present invention) controls each units and causes the processing results to be stored in the RAM 42 or the NVRAM 43, according to the program read from the ROM 41. The network interface 44 is connected to an external computer (not shown in Figures), etc., via communication lines such as LAN, etc., enabling the data to be mutually communicated.

In addition to the printing unit 10 and the pattern sensor 15, the printer 1 also includes a display unit 47 and an operating unit 48. The display unit 47 includes a display and a lamp, which can display the operation conditions of various setting screens and devices. The operating unit 48 includes several buttons, through which a user can input various instructions.

Furthermore, the printer 1 includes a high-voltage application circuit 49 that applies voltage to the transfer roller 14, the developing roller 25 and the charger 29. The CPU 40 can adjust the magnitude of the voltage applied to the portions by controlling the high-voltage application circuit 49.

(Job Execution Process)

Figure 3:
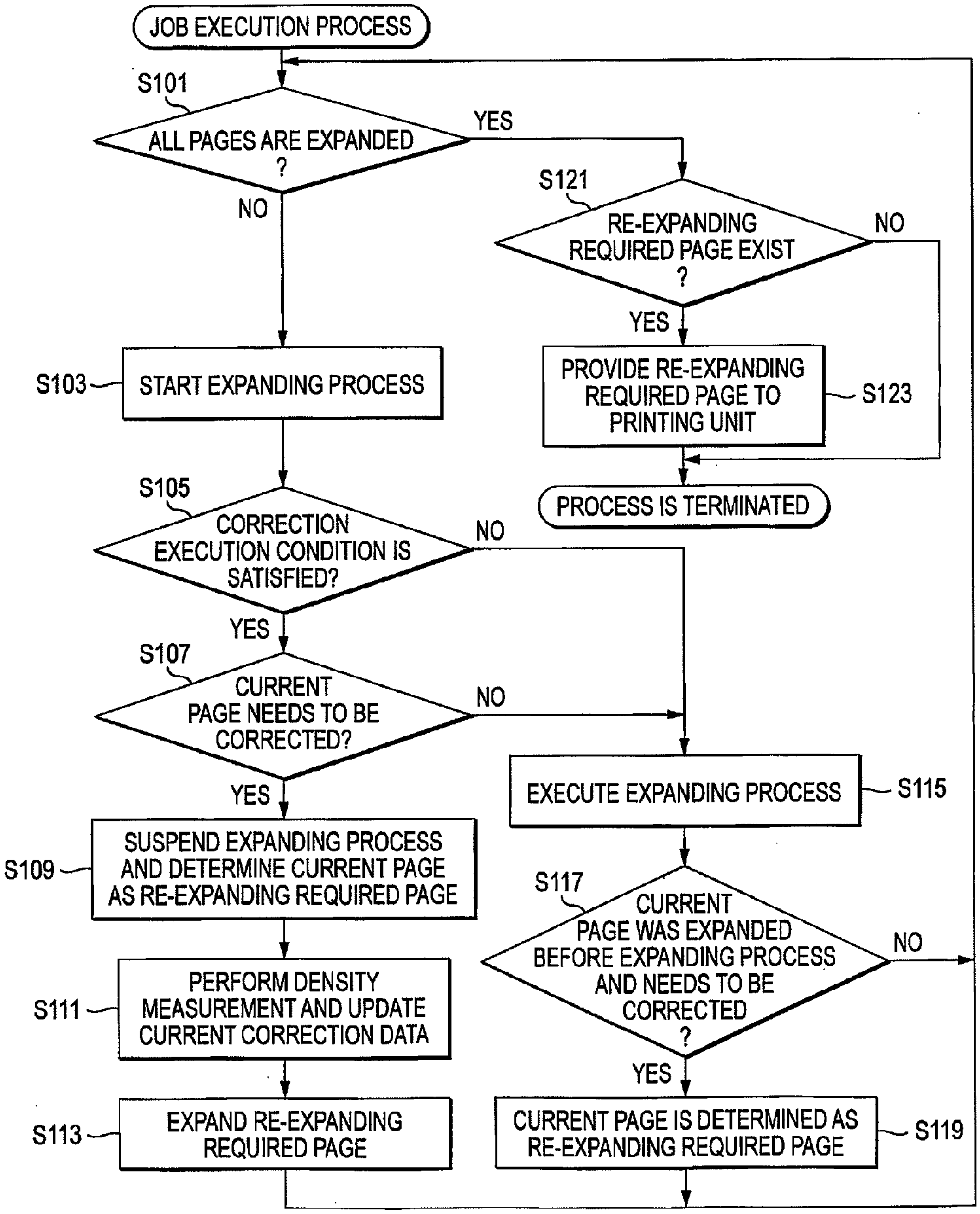
FIG. 3 is a flow chart showing a job execution process.

FIG. 3 is a flowchart showing a job execution process. When the CPU 40 receives a print job (an example of the "print request" of the present invention), which is sent from the external computer via the network interface 44, the CPU 40 registers the print job in a printer queue. Several print jobs can be registered in the printer queue. The CPU 40 executes the job execution process shown in FIG. 3 sequentially for each print job registered in the printer queue.

The print jobs received include a so-called secure job, that is, the print starts on condition that the user inputs a print starting instruction into the operating unit 48. When the secure job is received by the CPU 40, the CPU 40, for example, forbids a printing process (including an expanding process) by not registering the printing process in the printer queue but storing the printing process in the NVRAM 43. The CPU 40 registers the secure job in the printer queue when the print starting instruction is received by the operating unit 48, so as to become an object of the job execution process. In this way, the expanding process can be executed according to the measurement data (the density correction data described later) most recent to not the timing when the printing is requested but the timing when the printing is executed. In this case, the CPU 40 servers as the "receiving unit" of the present invention.

In the job execution process, the CPU 40 first determines whether the expanding process of the whole pages of the print job currently being processed (hereinafter called "current job") has finished (S101). The CPU 40 delivers expanded data per page to the printing unit 10 and causes the printing unit to print the image based on the expanded data on the sheet 3, each time the expanded data per page is generated.

If there is an unexpanded page (S101 is NO), the unexpanded print data (such as PDL data) per page starts to be expanded (S103). In the expanding process, the print data of a page currently being processed (hereinafter called "current page") is analyzed, and the intermediate data for each color is generated. The expanded data (bitmap data) is generated by adjusting a tone based on the density correction data stored in the current NVRAM 43 (hereinafter called "current correction data"), while the intermediate data is expanded. In this case, the CPU 40 serves as the "expanding unit" of the invention.

Next, the CPU 40 judges whether the predetermined correction execution condition is satisfied during the expanding process of the current page (S105). The correction execution condition is for determining whether it is necessary to execute density measurement (or the execution is desirable) to ensure image quality. Specifically, example of the conditions are, when time elapsed, rotation number of the photoconductive drum 28, total print number or temperature change, since the previous density measurement, exceeds a reference value, and when the correction instruction is input into the operating unit 48 by the user, etc.

(1) The Correction Execution Condition is Satisfied, and the Current Page Needs to be Corrected When the correction execution condition is satisfied (S105 is YES), the CPU 40 determines whether the current page is a page that needs to be corrected according to header information or an analysis result of the print data (S107). In this case, the CPU 40 serves as a "second determination unit" of the present invention. The page that needs to be corrected is a page requiring high quality print, for example, a color page, or a high-resolution page with a resolution above a predetermined level. A color page refers to a page that is printed by using more than one of black, yellow, magenta and cyan toners, and a monochrome page refers to a page that is printed by using one of the black, yellow, magenta and cyan toners. Meanwhile, a page formed by a single color toner other than black may be referred to as a color page instead of a monochrome page.

When the current page needs to be corrected (S107 is YES), the CPU 40 interrupts the expanding process of the current page, determines the current page as a "re-expanding required page" (S109), and stores an expanded data of an expanded portion of the re-expanding required page and a print data of an unexpanded portion of the re-expanding required page in, for example, the NVRAM 43. Thereafter, the density measurement as described below is performed, and the current correction data is updated according to a most recent density measurement data produced according to the measurement (S111).

Figure 4:
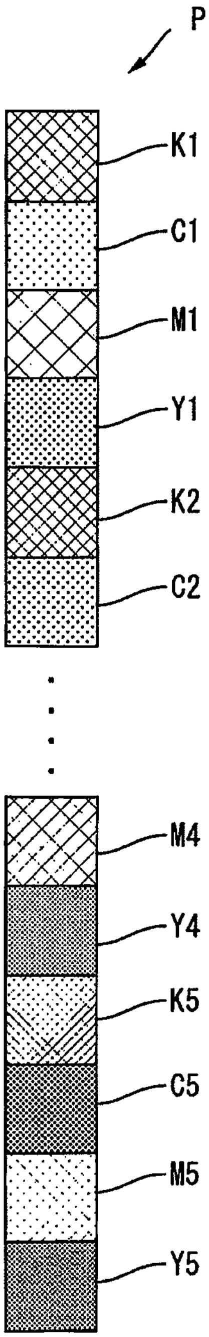
FIG. 4 is a diagram showing a density pattern.

In the density measurement, first, a density pattern P shown in FIG. 4 is formed on the belt 13 by the printing unit 10. The density pattern P is composed of several patches along the moving direction of the belt 13. In more detail, the density pattern P includes 5 patches with different densities for each color of black, yellow, magenta and cyan (black patches K1-K5, cyan patches C1-C5, magenta patches M1-M5, and yellow patches Y1-Y5, some of which are omitted from the drawings).

Next, the density of each patch is measured by the pattern sensor 15. According to the measurement, the density correction data for each color is generated respectively so that the density of the image formed on the sheets 3 by the printing unit 10 becomes an ideal density, for each of the tones formed by dividing the density range from 0% to 100% into 256 equal portions. The density correction data thus obtained contains adjusting values for adjusting the emission intensity of the LEDs of the LED heads 18 for each tone and adjusting values for adjusting the developing bias voltage (that is, adjusting the density of all tones). The CPU 40 stores the generated density correction data in the NVRAM 43 and updates the current correction data.

Next, with regard to the re-expanding required page stored in the NVRAM 43, the CPU 40 executes the expanding process while adjusting the tones by using the current correction data that has been updated (S113). Therefore, the printing unit 10 can print the image, the density of which is corrected by the most recent density correction data, on the sheet 3. In this case, the CPU 40 serves as the "control unit" of the invention.

The CPU 40 not only expands the unexpanded portion of the re-expanding required page that has been suspended of the expanding process, but also re-expands the expanded portion using the updated current correction data. Therefore, compared to the situation which only the unexpanded portion is expanded according to the updated current correction data, the print quality of the whole page can be improved.

Furthermore, although the print data of the unexpanded portion is expanded, the expanded data of the expanded portion, which had been expanded before the expanding process was suspended in S109, is stored in the NVRAM 43, and after the current correction data is updated, the stored expanded data is re-expanded by using the updated current correction data. The print data of the expanded portion before the expanding process may be expanded by using the updated current correction data. However, according to this configuration, the print data before the expanding process needs to be stored in the NVRAM 43 until the expanding process of the whole current page is completed, and the print data needs to be obtained from the external computer again. According to the first exemplary embodiment, the expanded data before the suspension of the expanding process, which was expanded by a previous current correction data, can be re-expanded by using the updated current correction data (that is, correction data generated after the suspension). Thus, it is unnecessary to store the print data before the expanding process in the NVRAM 43, etc.

After the CPU 40 completes the expanding process of all of the re-expanding required pages, the process returns to S101.

(2) The Correction Execution Condition is not Satisfied, or the Current Page does not Need to be Corrected When the correction execution condition is not satisfied (S105 is No), for the print data of the current page, the CPU 40 directly executes the expanding process without executing the density measurement (S115). Next, whether the current page was expanded before the expanding process is suspended during the current job (refer to S109), and whether the current page needs to be corrected is determined (S117).

If the current page is a page that is expanded before the suspension and needs to be corrected (S117 is YES), the current page is determined as the re-expanding required page (S119), and the printing process is suspended by storing the expanded data in the NVRAM 43 without delivering it to the printing unit 10. Then the process returns to S101. Accordingly, the page which was corrected before the suspension of the expanding process as well as the page whose process has been suspended in S109 is re-expanded by using the updated density correction data in S113. That is, for not only the page whose expanding process has been suspended but for also the previous pages that need to be corrected, the image whose density is corrected by the current density correction data can be printed on the sheet 3.

Thus, in the same printing job, the decrease in the print quality, such as difference in tones, can be prevented by using old and new density correction data which differs from each other. In addition, with regard to the current job, even if all of the pages are expanded (S101 is YES), there is possibility that the expanded pages that need to be corrected before interruption or the re-expanding required pages still remain unprinted. Therefore, whether the re-expanding required pages still remain unprinted should be determined (S121), and if it is determined that the re-expanding required pages still remain unprinted (S121 is YES), expanded data of the re-expanding required page is provided to the printing unit 10 (S123). If there is no re-expanding required page (S121 is NO) or if the expanded data of the re-expanding required pages is provided to the printing unit 10, the execution of the current job is terminated and the next printing job that has been registered in the printing queue will be started.

If the current page is not the page that is expanded before the suspension and needs to be corrected (S117 is NO), the current page is not determined as the re-expanding required page, and the expanded data is provided to the printing unit 10. Then, the process returns to S101. In addition, if the correction execution condition is satisfied but the current page is not the page that needs to be corrected (S105 is YES and S107 is NO), the process directly proceeds without executing the density measurement (S115), and then, it is determined NO in S117, and the process returns to S101. Accordingly, when the current page is not the data that needs to be corrected, such as monochrome image data, low resolution data, etc., the printing process can be executed promptly by executing the expanding process prior to the deviation amount measurement.

(3) Specific Examples

Figure 5:
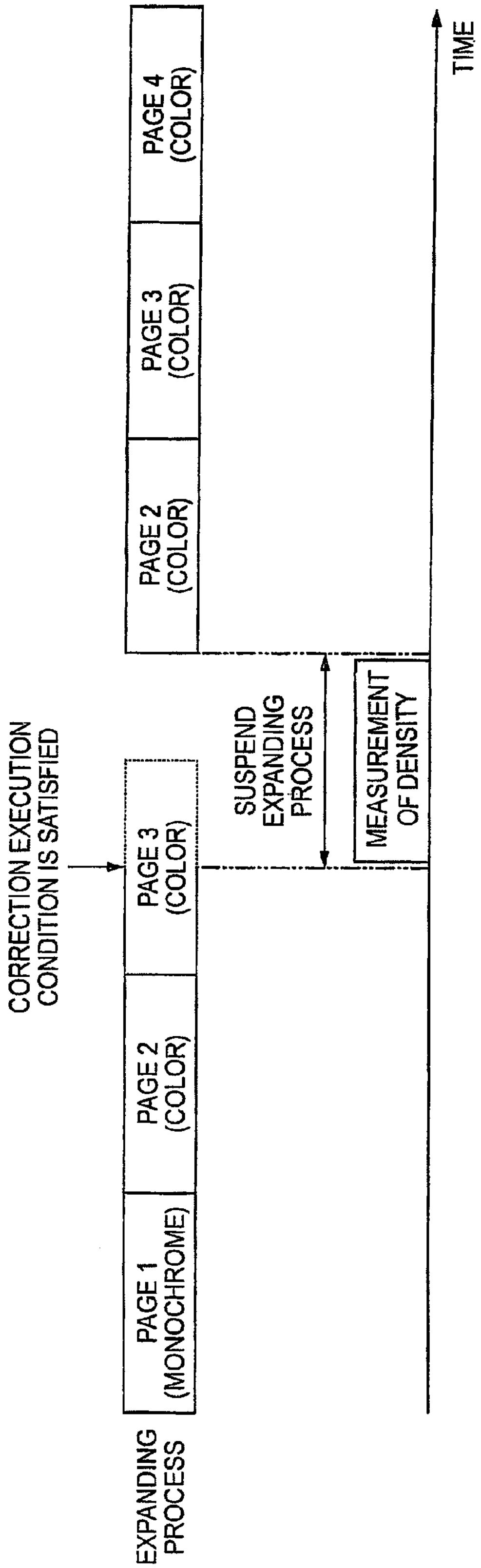
FIG. 5 is a time chart of an expanding process and a density measurement.

FIG. 5 is a time chart of the expanding process and density measurement. FIG. 5 shows a process corresponding to a 4 page print job, in which page 1 is a monochrome image and pages 2 to 4 are color images. As shown in FIG. 5, the expanding processes of the pages 1 and 2 are not suspended. However, because page 2 is a color page (S105 is NO, and S117 is YES), page 2 is determined as the re-expanding required page and the printing is suspended.

Next, if the correction execution condition is satisfied during the expanding of page 3 (S105 is YES), the expanding process is suspended at that time (S109). After the density measurement is performed (S111), the expanding process of pages 2 and 3 is restarted by using the current density correction data. Then, page 4 is also expanded by using the current density correction data.

(Effects of the Embodiment)

According to the above-described embodiment, if the correction execution condition is satisfied during the expanding of the current page (which is a single page), the expanding process of the current page is suspended, the density measurement is performed, and then, according to the measurement after the suspension, expanding of at least the unexpanded portion of the current page is started. Therefore, compared to the situation when the density measurement is performed after the expanding process of the current page or the current job is terminated, the delay in reflection of the measurement of the deviation amount in the expanding process of the print data can be prevented.

<Second Exemplary Embodiment>

Figure 6:
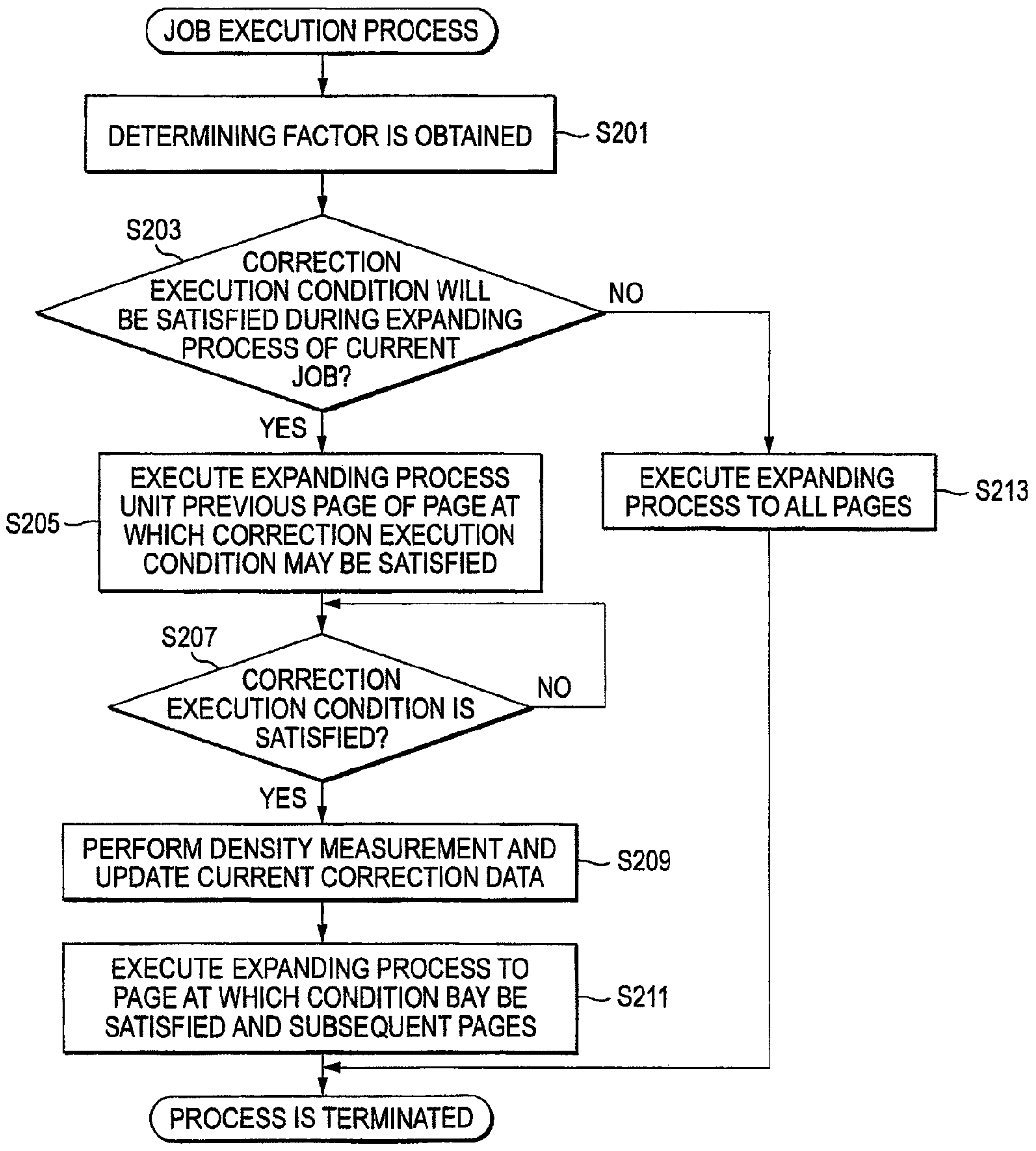
FIG. 6 is a flow chart showing a job execution process according to a second exemplary embodiment of the present invention.

FIG. 6 corresponds to the second exemplary embodiment of the present invention. The difference between the first exemplary embodiment and the second exemplary embodiment is the content of the job process, while others in the second exemplary embodiment are similar to those of the first exemplary embodiment. Thus, the symbols that are the same as those of the first exemplary embodiment may be omitted, and the following description is based on features that differ from the first exemplary embodiment.

FIG. 6 is a flowchart showing a job process of the present embodiment. The CPU 40 executes the job execution process shown in FIG. 6 sequentially for each print job registered in the printer queue. First, determining factor, for predictively determining whether the correction execution condition may be satisfied during expanding processes of the current job, is obtained (S201).

Examples of the determining factors are listed in the following.

(a) When the correction execution condition is that the total print number since the previous density measurement is higher than a predetermined amount, accumulated total printed pages P1 which shows the accumulated total number of pages printed before the expanding process is executed to the current page and current job printed pages P2 which shows the total number of pages printed during executing the current job are the determining factors. When the sum of the accumulated total printed pages P1 and the current job printed pages P2 (P1+P2) is larger than the predetermined amount, it is determined that the correction execution condition may be satisfied during the expanding processes of the current job. Meanwhile, when the sum is smaller than the predetermined amount, it is determined that the correction execution condition will not be satisfied during the expanding processes of the current job.

(b) When the correction execution condition is that the elapsed time since the previous density measurement is larger than a predetermined amount, elapsed time T1 until the printing is requested (or before the expanding process of the current job) and printing time T2 of the current job are the determining factors. When the sum of the elapsed time T1 and the printing time T2 of the current job is larger than the predetermined amount, it is determined that the correction execution condition may be satisfied during the expanding processes of the current job. Meanwhile, when the sum is smaller than the predetermined amount, it is determined that the correction execution condition will not be satisfied during the expanding processes of the current job. The printing time 2 can be predicted from the print data amount and the printed pages of the current job.

If the CPU 40 determines that the correction execution condition will not be satisfied during the expanding processes of the current job (S203 is NO), the CPU 40 will adjust the tone by using the current correction data while executing the expanding process, for all of the pages of the current job, without performing the density measurement (S213). Then, the execution of this job is terminated.

If the CPU 40 determines that the correction execution condition will be satisfied during the expanding processes of the print job (S203 is YES), the CPU 40 will adjust the tone by using the current correction data while executing the expanding process (S205), until a previous page of a page at which the correction execution condition may be satisfied at a high possibility during the expanding process (hereinafter called "the page at which the condition may be satisfied"), without performing the density measurement. However, with regard to the pages subsequent to the page at which the condition may be satisfied, the expanding process will be delayed until the correction execution condition is satisfied (S207 is NO). Similarly to S111 of FIG. 3, when the correction execution condition is satisfied (S207 is YES), the density measurement is performed. The current correction data is updated based on the current density measurement data produced according to the measurement (S209).

Next, with regard to the page at which the condition may be satisfied and pages subsequent to the page at which the condition may be satisfied, the tone is adjusted by using the updated current correction data while executing the expanding process (S211). Then, this job is terminated. Therefore, the printing unit 10 can print the image, whose density has been corrected by the most recent current density correction data, on the sheets 3.

As described above, according to the second exemplary embodiment of the present invention, when a print request is received, whether the correction execution condition may be satisfied during the expanding process of the print data corresponding to the print request can be predictively determined before the expanding process of the print data. When it is determined that the correction execution condition may be satisfied, based on the prediction, the expanding process of the print data is delayed, and then the deviation amount is measured. Subsequently, the print data which was stored is started to be expanded based on the measured deviation amount. According to this configuration, compared to that the density measurement is performed after the expanding process of the current page or the current job is terminated, the delay in reflection of the current density correction data to the expanding process of the print data can be prevented. Further, for the page in which the condition may be satisfied, because it can be previously avoided that the correction condition is satisfied during the expanding process, the decrease in the print quality such as deviation in tones, which occurs by using both the old and new density correction data, can be prevented.

<Other Embodiments>

While the present invention has been showed and described with reference to certain exemplary embodiments thereof, it will be understood by those skilled in the art that various changes in form and details may be made therein without departing from the spirit and scope of the invention. Specifically, among the components described in each exemplary embodiment, components other than the components belonging to the broadest concept of the invention are additive, and can be omitted.

(1) A printer that forms an image by electrophotographic method is described in the above-described exemplary embodiments. However, for example, the present invention can also be applied to image forming apparatuses using other methods such as inkjet method. Further, the invention can also be applied when data received by facsimile is printed, data captured by a scanner (copy) is printed and data obtained from external storage media (direct printing) is printed as an example of the image forming.

(2) According to the above-described exemplary embodiments, when the correction execution condition is satisfied, the density measurement is performed, and the density of the image is corrected according to the density measurement. However, the scope of the invention is not limited by the above configuration. For example, it may be configured that a heretofore known correction pattern for correcting the deviation amount of the position is formed on the belt 13, and the deviation amount of the position (color deviation amount) between images of different colors is measured by the pattern sensor 15, and the deviation amount of the position is corrected according to the measurement.

What is claimed is:

1. A printing apparatus comprising:

a printing section configured to print an image based on expanded data; and a control device configured to:

measure a deviation amount of at least one of a position and a density of the image printed by the printing section when a correction execution condition is satisfied; and expand print data based on the measured deviation amount so as to produce the expanded data, wherein when the correction execution condition is satisfied during the expanding of current print data which corresponds to a current page being expanded, the control device is configured to suspend the expanding of the current page being expanded so that an unexpanded portion of the current page remains, measure the deviation amount, and restart expanding the unexpanded portion of the current page based on the measurement performed after the expanding is suspended, and wherein the expanded data is generated by analyzing the print data, generating intermediate data based on the print data, and expanding the intermediate data while adjusting the intermediate data based on the measured deviation amount.

2. The printing apparatus according to claim 1, wherein the control device is configured to expand not only the unexpanded portion of the current print data but also an expanded portion of the current print data based on the measurement performed after the expanding is suspended.

3. The printing apparatus according to claim 2, wherein, when expanding the expanded portion of the current print data, the control device is configured to further expand the expanded data corresponding to the expanded portion of the current print data, which was produced before the suspension of the expanding, based on the measurement performed after the expanding is suspended.

4. The printing apparatus according to claim 1, wherein the control device is further configured to determine whether the print data is data that needs to be corrected, and wherein, when the control device determines that the print data is not the data that needs to be corrected, the control device is configured to expand the print data without measuring the deviation amount, even if the correction execution condition is satisfied during expanding of the print data.

5. The printing apparatus according to claim 1, wherein the control device is further configured to receive a print starting instruction from a user, and wherein when the control device receives a print request to start printing when the print starting instruction is received, the control device is configured to start the expanding when or after the print starting instruction is received.

6. A printing apparatus comprising:

a printing section configured to print an image based on expanded data;

a control device configured to:

measure a deviation amount of at least one of a position and a density of the image printed by the printing section when a correction execution condition is satisfied; and expand print data based on the measured deviation amount so as to produce the expanded data; and a predicting section, wherein when a print request is received, the predicting section is configured to predict whether the correction execution condition may be satisfied during the expanding of the print data corresponding to the print request, before any of the print data corresponding to the print request is expanded, wherein when the predicting section determines that the correction execution condition may be satisfied, the control device is configured to delay the expanding of the print data, measure the deviation amount, and start expanding the print data which was delayed from expanding based on the measurement performed after the expanding is delayed, and wherein the expanded data is generated by analyzing the print data, generating intermediate data based on the print data, and expanding the intermediate data while adjusting the intermediate data based on the measured deviation amount.

7. The printing apparatus according to claim 6, further comprising:

a determining section configured to determine whether the print data is data that needs to be corrected, wherein, when the determining section determines that the print data is not the data that needs to be corrected, the control device is configured to expand the print data without measuring the deviation amount, even if the correction execution condition is satisfied during expanding of the print data.

8. The printing apparatus according to claim 6, further comprising:

a receiving section, which is configured to receive a print starting instruction from a user, wherein when the control device receives a print request to start printing when the receiving section receives the print starting instruction, the control device is configured to start the expanding when or after the receiving section receives the print starting instruction.

9. The printing apparatus according to claim 6, wherein the predicting section predicts a specific page at which the correction execution condition may be satisfied at a high possibility during the expanding.

10. A non-transitory computer readable storing medium storing a computer program for causing a printing apparatus, the printing apparatus comprising a printing section configured to print an image based on expanded data, to perform a method of:

measuring a deviation amount of at least one of a position and a density of the image printed by the printing section when a correction execution condition is satisfied;

expanding print data based on the measured deviation amount so as to produce the expanded data; and when the correction execution condition is satisfied during the expanding of the current page being expanded so that an unexpanded portion of the current page remains, suspending the expanding of the current page, measuring the deviation amount, and restarting expanding the unexpanded portion of the current page based on the measurement performed after the expanding is suspended, wherein expanding the print data comprises analyzing the print data, generating intermediate data based on the print data, and expanding the intermediate data while adjusting the intermediate data based on the measured deviation amount.

11. A non-transitory computer readable storing medium storing a computer program for causing a printing apparatus, the printing apparatus comprising a printing section configured to print an image based on expanded data, to perform a method of:

measuring a deviation amount of at least one of a position and a density of the image printed by the printing section when a correction execution condition is satisfied;

expanding print data based on the measured deviation amount so as to produce the expanded data;

predicting whether the correction execution condition may be satisfied during the expanding of the print data corresponding to the print request, before any of the print data corresponding to the print request is expanded, when a print request is received, and when it is predicted that the correction execution condition may be satisfied, delaying the expanding of the print data, measuring the deviation amount, and starting expanding the print data which was delayed from expanding based on the measurement performed after the expanding is delayed, wherein expanding the print data comprises analyzing the print data, generating intermediate data based on the print data, and expanding the intermediate data while adjusting the intermediate data based on the measured deviation amount.

12. The computer readable storing medium according to claim 11, wherein predicting a specific page at which the correction execution condition may be satisfied at a high possibility during the expanding.

* * * * *